US010002824B2

(12) United States Patent
Agrawal et al.

(10) Patent No.: US 10,002,824 B2
(45) Date of Patent: Jun. 19, 2018

(54) MAGNETIC ALIGNMENT FOR FLIP CHIP MICROELECTRONIC DEVICES

(71) Applicant: INTEL CORPORATION, Santa Clara, CA (US)

(72) Inventors: Ankur Agrawal, Chandler, AZ (US); Srinivas S. Moola, Phoenix, AZ (US); Sujit Sharan, Chandler, AZ (US); Vijay Govindarajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/619,463

(22) Filed: Jun. 10, 2017

(65) Prior Publication Data
US 2017/0278783 A1    Sep. 28, 2017

Related U.S. Application Data

(62) Division of application No. 14/941,571, filed on Nov. 14, 2015, now Pat. No. 9,711,443.

(51) Int. Cl.
*H01L 21/48* (2006.01)
*H01L 23/498* (2006.01)
(Continued)

(52) U.S. Cl.
CPC .... *H01L 23/49838* (2013.01); *H01L 21/4846* (2013.01); *H01L 23/02* (2013.01);
(Continued)

(58) Field of Classification Search
CPC . H01L 2224/75733; H01L 2224/76733; H01L 2224/95144; H01L 23/49866; H01L 23/02; H01L 21/67709
See application file for complete search history.

(56) References Cited

U.S. PATENT DOCUMENTS 4,004,298 A * 1/1977 Freed ............... A61M 39/0247
  285/9.1
4,983,804 A * 1/1991 Chan ..................... B23K 1/002
  219/616
(Continued)

FOREIGN PATENT DOCUMENTS

KR  10-20050069938  7/2005
KR  10-1013554  2/2011
(Continued)

OTHER PUBLICATIONS

International Search Report and Written Opinion for International Patent Application No. PCT/US16/52819, dated Dec. 20, 2016.
(Continued)

*Primary Examiner* — Earl Taylor
(74) *Attorney, Agent, or Firm* — Green, Howard & Mughal LLP.

(57) ABSTRACT

Incorporating at least one magnetic alignment structure on a microelectronic device and incorporating at least one alignment coil within a microelectronic substrate, wherein the alignment coil may be powered to form a magnetic field to attract the magnetic alignment structure, thereby aligning the microelectronic device to the microelectronic substrate. After alignment, the microelectronic device may be electrically attached to the substrate. Embodiments may include additionally incorporating an alignment detection coil within the microelectronic substrate, wherein the alignment detection coil may be powered to form a magnetic field to detect variations in the magnetic field generated by the alignment coil in order verify the alignment of the microelectronic device to the microelectronic substrate.

17 Claims, 9 Drawing Sheets

(51) Int. Cl.
  *H01L 23/00* (2006.01)
  *H01L 23/02* (2006.01)
(52) U.S. Cl.
  CPC ...... *H01L 23/49866* (2013.01); *H01L 23/564* (2013.01); *H01L 24/16* (2013.01); *H01L 24/81* (2013.01); *H01L 2224/16225* (2013.01); *H01L 2224/81143* (2013.01); *H01L 2924/01028* (2013.01)

(56) References Cited

U.S. PATENT DOCUMENTS

| | | | | |
|---|---|---|---|---|
| 5,986,348 A * | 11/1999 | Fukano | H01L 24/10 | 257/780 |
| 6,049,974 A * | 4/2000 | Asanasavest | H01L 21/68 | 29/832 |
| 6,825,049 B2 * | 11/2004 | Fonstad, Jr. | H01L 21/2007 | 257/E21.122 |
| 6,833,277 B2 * | 12/2004 | Fonstad, Jr. | H01L 21/2007 | 257/E21.122 |
| 6,888,178 B2 * | 5/2005 | Fonstad, Jr. | H01L 21/2007 | 257/190 |
| 7,311,526 B2 * | 12/2007 | Rohrbach | H01R 13/6205 | 439/218 |
| 7,323,757 B2 * | 1/2008 | Fonstad, Jr. | H01L 21/2007 | 257/421 |
| 7,615,836 B2 * | 11/2009 | Lian | G06K 19/07749 | 257/108 |
| 7,888,140 B2 * | 2/2011 | Lian | G06K 19/07749 | 257/E21.579 |
| 7,956,382 B2 * | 6/2011 | Fonstad, Jr. | H01L 21/2007 | 257/183 |
| 7,994,608 B2 * | 8/2011 | Tan | H01L 24/81 | 257/531 |
| 8,138,868 B2 * | 3/2012 | Arnold | B81C 1/00007 | 29/729 |
| 8,188,581 B2 * | 5/2012 | Shi | H01L 23/13 | 257/673 |
| 8,313,958 B2 * | 11/2012 | Swaminathan | H01L 24/11 | 257/E21.499 |
| 8,939,347 B2 * | 1/2015 | Swaminathan | B82Y 25/00 | 228/122.1 |
| 8,952,489 B2 * | 2/2015 | Elian | H01L 23/5389 | 257/531 |
| 9,010,618 B2 * | 4/2015 | Aleksov | B23K 1/0016 | 228/180.21 |
| 2003/0182794 A1 * | 10/2003 | Fonstad, Jr. | H01L 21/2007 | 29/744 |
| 2003/0183904 A1 * | 10/2003 | Fonstad, Jr. | H01L 21/2007 | 257/622 |
| 2003/0186469 A1 * | 10/2003 | Fonstad, Jr. | H01L 21/2007 | 438/3 |
| 2003/0234401 A1 * | 12/2003 | Fonstad, Jr. | H01L 21/2007 | 257/84 |
| 2004/0016717 A1 * | 1/2004 | Fonstad | H01L 21/2007 | 216/2 |
| 2004/0016998 A1 * | 1/2004 | Fonstad | H01L 21/2007 | 257/678 |
| 2006/0022784 A1 * | 2/2006 | Kopp | B81B 7/007 | 336/100 |
| 2006/0197213 A1 * | 9/2006 | Lian | G06K 19/07749 | 257/687 |
| 2008/0218299 A1 * | 9/2008 | Arnold | B81C 1/00007 | 335/306 |
| 2008/0265367 A1 * | 10/2008 | Tan | H01L 24/81 | 257/531 |
| 2009/0181556 A1 * | 7/2009 | Rohrbach | H01R 13/6205 | 439/39 |
| 2010/0015730 A1 * | 1/2010 | Lian | G06K 19/07749 | 438/3 |
| 2010/0137779 A1 * | 6/2010 | Seitz | A61N 1/30 | 604/20 |
| 2010/0159692 A1 * | 6/2010 | Swaminathan | H01L 24/81 | 438/613 |
| 2010/0197148 A1 * | 8/2010 | Rudisill | H01R 11/30 | 439/40 |
| 2011/0074011 A1 * | 3/2011 | Shi | H01L 23/13 | 257/723 |
| 2011/0266030 A1 * | 11/2011 | Swaminathan | B82Y 25/00 | 174/126.2 |
| 2011/0278044 A1 * | 11/2011 | Aleksov | B23K 1/0016 | 174/126.1 |
| 2011/0278351 A1 * | 11/2011 | Aleksov | B23K 1/0016 | 228/234.1 |
| 2011/0281375 A1 * | 11/2011 | Swaminathan | H01L 24/11 | 438/3 |
| 2012/0153745 A1 * | 6/2012 | Pagani | H01L 23/5227 | 307/104 |
| 2013/0199831 A1 | 8/2013 | Morris | | |
| 2014/0293529 A1 | 10/2014 | Nair et al. | | |
| 2014/0357020 A1 * | 12/2014 | Aleksov | H01L 24/92 | 438/107 |
| 2015/0021632 A1 * | 1/2015 | Taghizadeh | H05K 1/097 | 257/88 |
| 2015/0111399 A1 * | 4/2015 | Karls | H01R 13/6205 | 439/39 |
| 2015/0340338 A1 * | 11/2015 | Lee | H01L 25/0655 | 257/531 |
| 2015/0349438 A1 * | 12/2015 | Allen | H01R 13/6205 | 439/40 |

FOREIGN PATENT DOCUMENTS

| | | | |
|---|---|---|---|
| KR | 10-1552946 | 9/2015 | |
| WO | 03063570 | 7/2003 | |
| WO | WO 03063570 A2 * | 7/2003 | ......... H01L 21/2007 |
| WO | 2006096378 | 9/2006 | |
| WO | WO 2006096378 A1 * | 9/2006 | ....... G06K 19/07749 |

OTHER PUBLICATIONS

Notice of Allowance for U.S. Appl. No. 14/941,571, dated Apr. 4, 2017.
Office Action for U.S. Appl. No. 14/941,571, dated Dec. 29, 2016.
Restriction Requirement for U.S. Appl. No. 14/941,571, dated Oct. 6, 2016.

* cited by examiner

MAGNETIC ALIGNMENT FOR FLIP CHIP MICROELECTRONIC DEVICES

RELATED APPLICATION

The present application is a divisional of U.S. patent application Ser. No. 14/941,571, filed on Nov. 14, 2015, entitled "MAGNETIC ALIGNMENT FOR FLIP CHIP MICROELECTRONIC DEVICES", which is hereby incorporated herein in their entirety and for all purposes.

TECHNICAL FIELD

Embodiments of the present description generally relate to the field of microelectronic device fabrication, and, more particularly, to methods and apparatus for aligning a flip-chip microelectronic device on a microelectronic substrate for attachment thereto.

BACKGROUND

Microelectronic devices are generally fabricated from various microelectronic components, including, but not limited to, at least one microelectronic die (such as a microprocessor, a chipset, a graphics device, a wireless device, a memory device, an application specific integrated circuit, or the like) with is attached to a microelectronic substrate (such as interposers, motherboards, and the like) through interconnects extending therebetween in a configuration generally known as a flip-chip or controlled collapse chip connection ("C4") configuration.

The microelectronic industry is continually striving to produce ever faster and smaller microelectronic devices for use in various electronic products, including, but not limited to portable products, such as portable computers, digital cameras, electronic tablets, cellular phones, and the like. As the size of the microelectronic components, such as microelectronic devices and microelectronic substrates, are reduced, it becomes more difficult to align the microelectronic devices to the microelectronic substrates. Therefore, there is a need to develop apparatus and methods for the alignment of these microelectronic devices to the microelectronic substrates.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
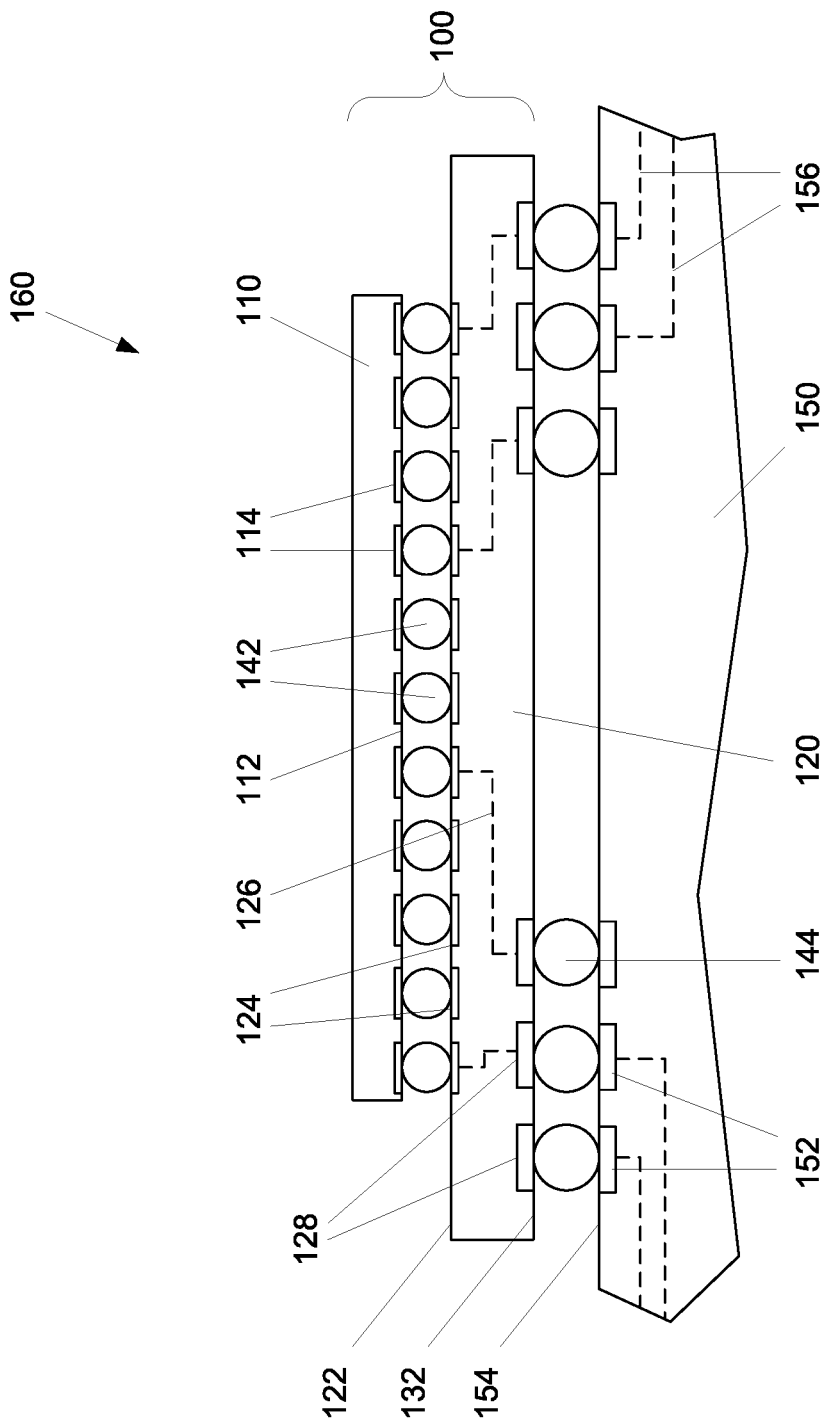
FIG. 1 is a side cross sectional view of a microelectronic structure, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

In the production of microelectronic structures, microelectronic packages are generally mounted on microelectronic board/substrates that provide electrical communication routes between the microelectronic packages and external components. As shown in FIG. 1, a microelectronic package 100 may comprise a microelectronic die 110, such as a microprocessor, a chipset, a graphics device, a wireless device, a memory device, an application specific integrated circuit, or the like, attached to a first surface 122 of a microelectronic interposer/substrate 120 through a plurality of solder interconnects 142 in a configuration generally known as a flip-chip or controlled collapse chip connection ("C4") configuration. The die-to-interposer/substrate solder interconnects 142 may extend from interconnection pads 114 on an active surface 112 of the microelectronic die 110 and interconnection pads 124 on the microelectronic interposer/substrate first surface 122. The microelectronic die interconnection pads 114 may be in electrical communication with integrated circuitry (not shown) within the microelectronic die 110. The microelectronic interposer/substrate 120 may include at least one conductive route 126 extending therethrough from at least one microelectronic interposer/substrate interconnection pad 124 and at least one microelectronic package interconnection pad 128 on or proximate a second surface 132 of the microelectronic interposer/substrate 120. The microelectronic interposer/substrate 120 may reroute a fine pitch (center-to-center distance between the microelectronic device interconnection pads 114) of the microelectronic device interconnection pads 114 to a relatively wider pitch of the microelectronic package interconnection pads 128.

The microelectronic package 100 may be attached to a microelectronic board/substrate 150, such as printed circuit board, a motherboard, and the like, through a plurality of solder interconnects 144, to form a microelectronic structure 160. The package-to-board/substrate solder interconnects 144 may extend between the microelectronic package interconnection pads 128 and substantially mirror-image interconnection pads 152 on an attachment surface 154 of the microelectronic board/substrate 150. The microelectronic board/substrate interconnection pads 152 may be in electrical communication with conductive routes (shown as dashed lines 156) within the microelectronic board/substrate 150. The microelectronic board/substrate conductive routes 156 may provide electrical communication routes to external components (not shown).

Both the microelectronic interposer/substrate 120 and the microelectronic board/substrate 150 may be primarily composed of any appropriate dielectric material, including, but not limited to, bismaleimine triazine resin, fire retardant grade 4 material, polyimide materials, glass reinforced epoxy matrix material, and the like, as well as laminates or multiple layers thereof. The microelectronic interposer/substrate conductive routes 126 and the microelectronic board/substrate conductive routes 156 may be composed of any conductive material, including but not limited to metals, such as copper and aluminum, and alloys thereof. As will be understood to those skilled in the art, microelectronic interposer/substrate conductive routes 126 and the microelectronic board/substrate conductive routes 156 may be formed as a plurality of conductive traces (not shown) formed on layers of dielectric material (not shown), which are connected by conductive vias (not shown).

The device-to-interposer/substrate solder interconnects 142 and the package-to-board/substrate solder interconnects 144 can be made of any appropriate solder material, including, but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. The solder may be reflowed, either by heat, pressure, and/or sonic energy to secure the solder between the respective interconnections pads, as will be understood to those skilled in the art.

Embodiments of the present description include magnetic alignment apparatus and method of alignment for either a microelectronic die to an interposer/substrate, a microelectronic package to a motherboard/substrate, or a microelectronic die to a motherboard/substrate. Therefore, for the sake of clarity and conciseness, the term "microelectronic device" used hereafter refers to either a microelectronic die or a microelectronic package, and the term "microelectronic substrate" used hereafter refers to either an interposer/substrate or a motherboard/substrate. Furthermore, the term "magnetic" includes any material that is affected by a magnetic field, including but not limited to, magnetic, ferromagnetic, paramagnetic, diamagnetic, antiferromagnetic, and spin glass behavior.

Figure 2:
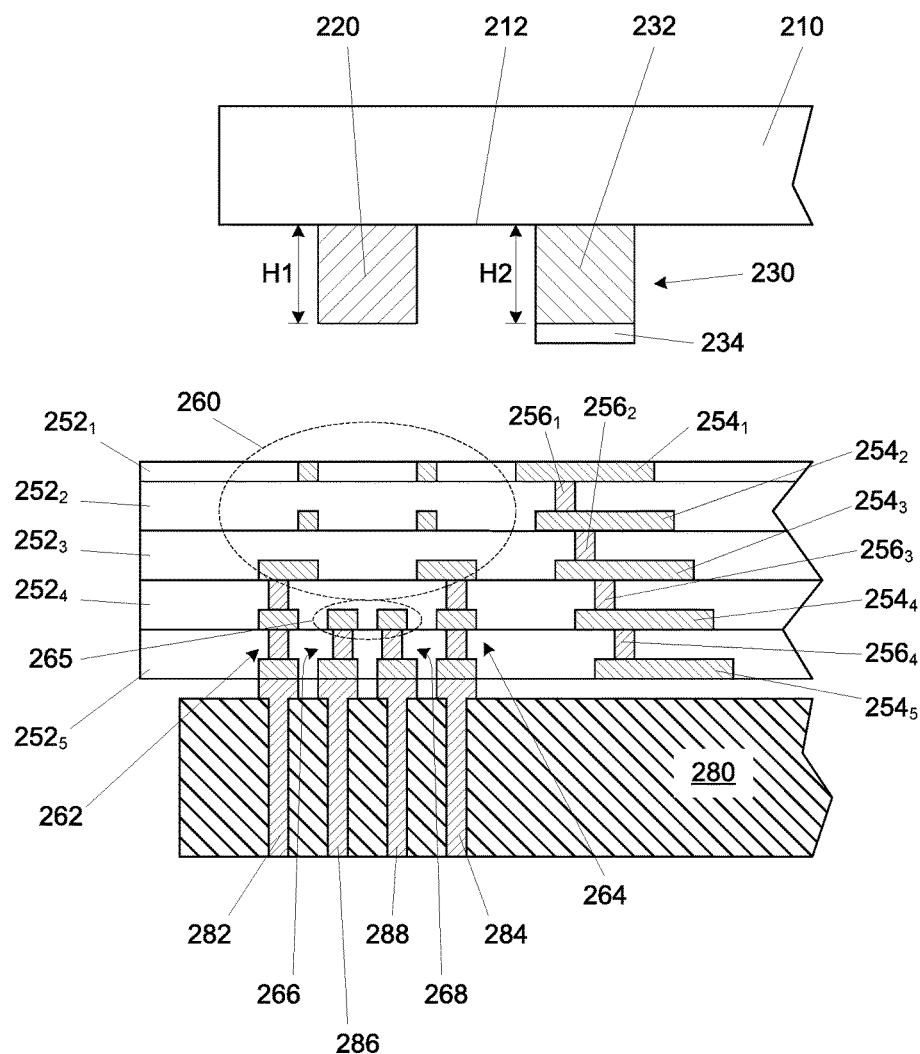
FIGS. 2-4 are side cross sectional views of microelectronic devices and microelectronic substrates, according to embodiments of the present description.

As shown in FIG. 2, a microelectronic device 210 may include at least one magnetic alignment structure 220 and at least one interconnect structure 230 extending from an attachment surface 212 of the microelectronic device 210. The interconnect structure 230 may include a bump or pillar 232, such as a copper structure, having a layer of solder material 234 disposed on the bump or pillar 232 at a position opposing the microelectronic device attachment surface 212.

A microelectronic substrate 240 may comprise a plurality of dielectric layers $252_1$-$252_5$ and metallizations, such as conductive traces $254_1$-$254_5$ connected with conductive vias $256_1$-$256_4$. An alignment coil 260 may be formed within the dielectric layers (shown formed within the dielectric layers $252_1$-$252_3$). An alignment detection coil 265 may optionally be formed within the dielectric layers (shown formed within the dielectric layer $252_4$) proximate the alignment coil 260. The alignment coil 260 and the alignment detection coil 265 may be formed during the formation of the conductive traces $254_1$-$254_5$ and the conductive vias $256_1$-$256_4$ and may be formed from the same conductive materials, as will be understood to those skilled in the art. Although the microelectronic substrate 240 is illustrated as a coreless substrate, it is understood that the microelectronic substrate 240 could include a core (no shown).

Figure 3:
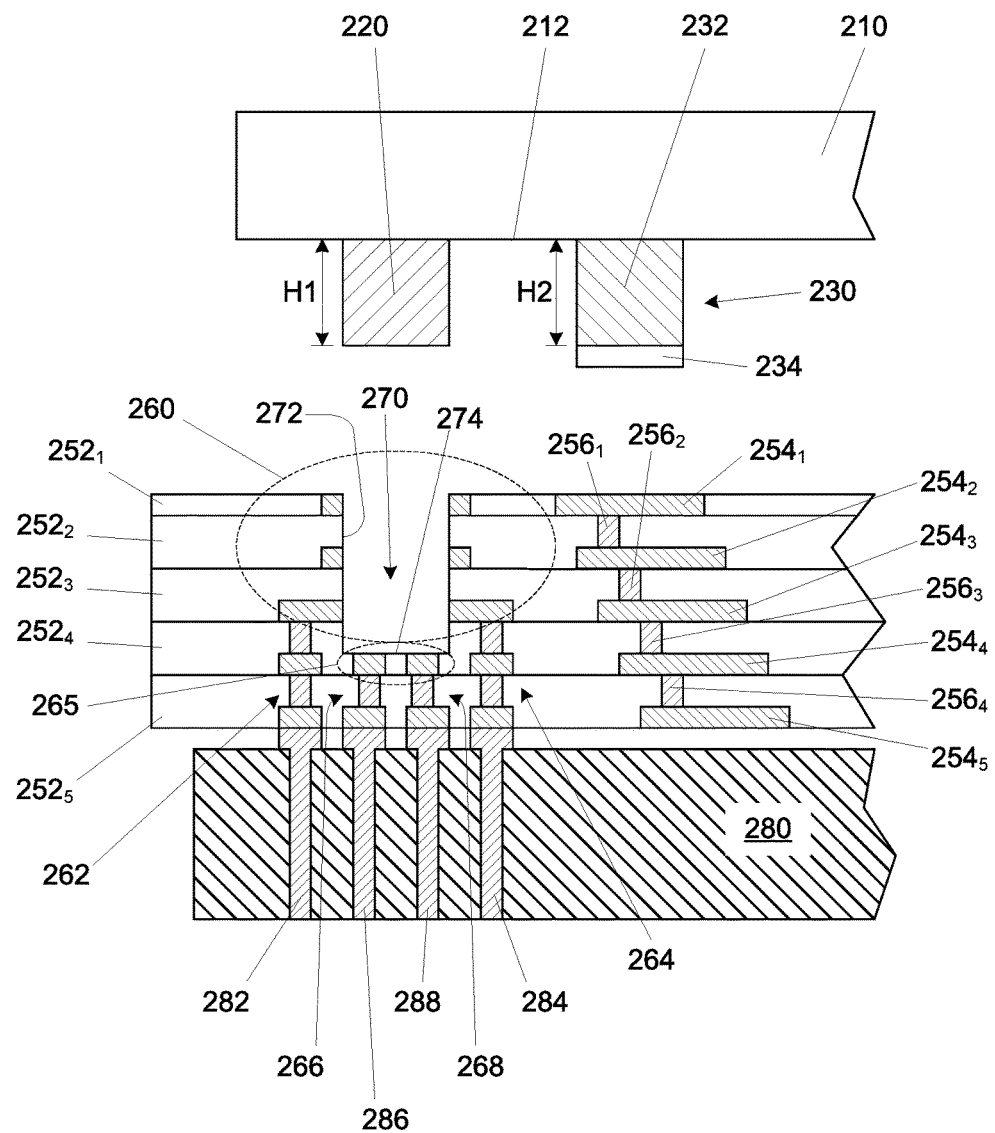

As shown in FIG. 3, an opening 270 may optionally be formed to extending into the microelectronic substrate 240 from a first surface 242 of the microelectronic substrate 240, such that at least a portion of the alignment coil 260 is exposed at a sidewall 272 of the opening 270 and that at least a portion of the alignment detection coil 265 is exposed at a bottom 274 of the opening 270.

As shown in FIGS. 2 and 3, the alignment coil 260 may be connected to a first power line 262 and a second power line 264 extending from the alignment coil 260 to a second surface 244 of the microelectronic substrate 240 to operate the alignment coil 260. As shown, the first power line 262 and the second power line 264 may contact a first power contact 282 and a second power contact 284 in a chuck 280, such as a thermocompression bonding chuck, used during the attachment of the microelectronic device 210 to the microelectronic substrate 240, wherein the first power contact 282 and the second power contact 284 provide power to the first power line 262 and the second power line 264, respectively.

As also shown in FIGS. 2 and 3, the alignment detection coil 265 may be connected to a third power line 266 and a fourth power line 268 extending from the alignment detection coil 265 to the second surface 244 of the microelectronic substrate 240 to operate the alignment detection coil 265. As shown, the third power line 266 and the fourth power line 268 may contact a third power contact 286 and a fourth power contact 288 in the chuck 280, wherein the third power contact 286 and the fourth power contact 288 provide power to the third power line 266 and the fourth power line 268, respectively.

Figure 4:
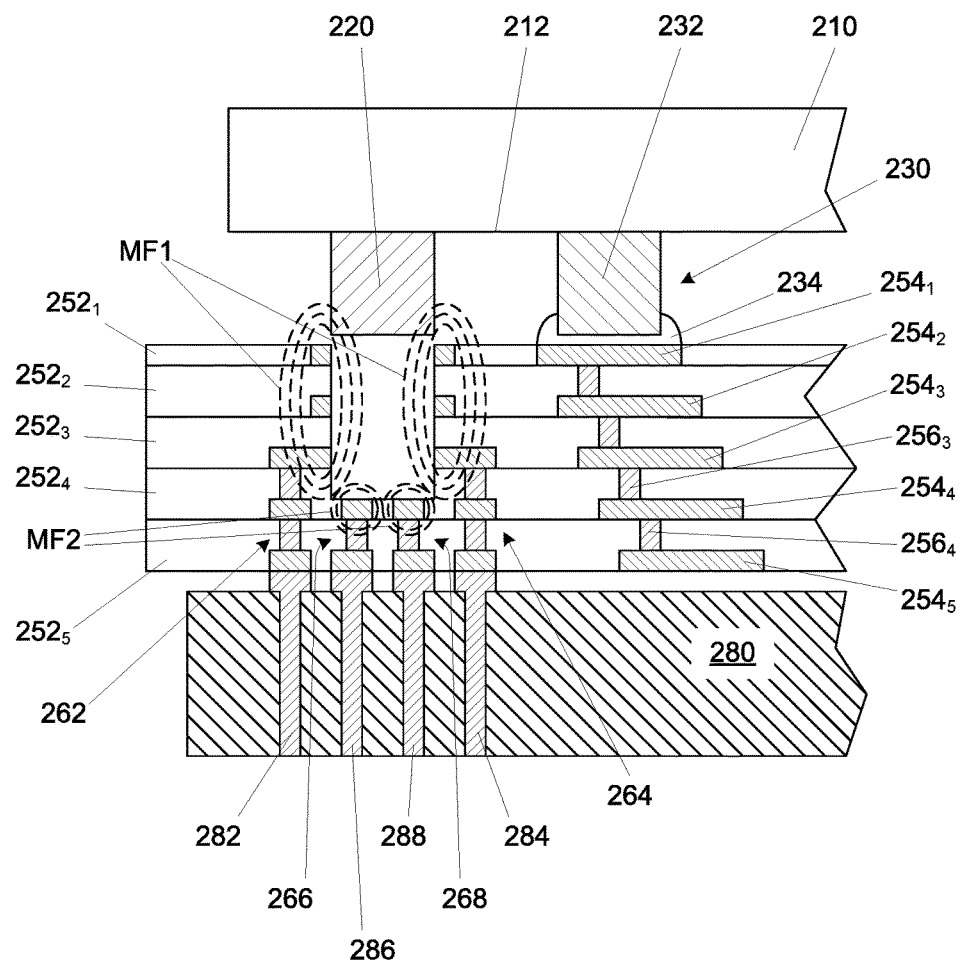

As shown in FIG. 4, when attaching the microelectronic device 210 to the microelectronic substrate 240, the alignment coil 260 is powered to form a temporary magnetic field MF1 (shown as concentric ovals) which attracts the magnetic alignment structure 220 thereto thereby aligning the microelectronic device 210. As the magnetic alignment structure 220 is aligned, there will be a surge in the eddy current of the magnetic field MF1 with little or no eddy current when the magnetic alignment structure 220 is aligned. Thus, the alignment detection coil 265 can be powered to form a temporary magnetic field MF2 (shown as concentric circles) used to detect the change in the eddy current of the magnetic field MF1 generated by the alignment coil 260 and verify the alignment of the microelectronic device 210.

Figure 5:
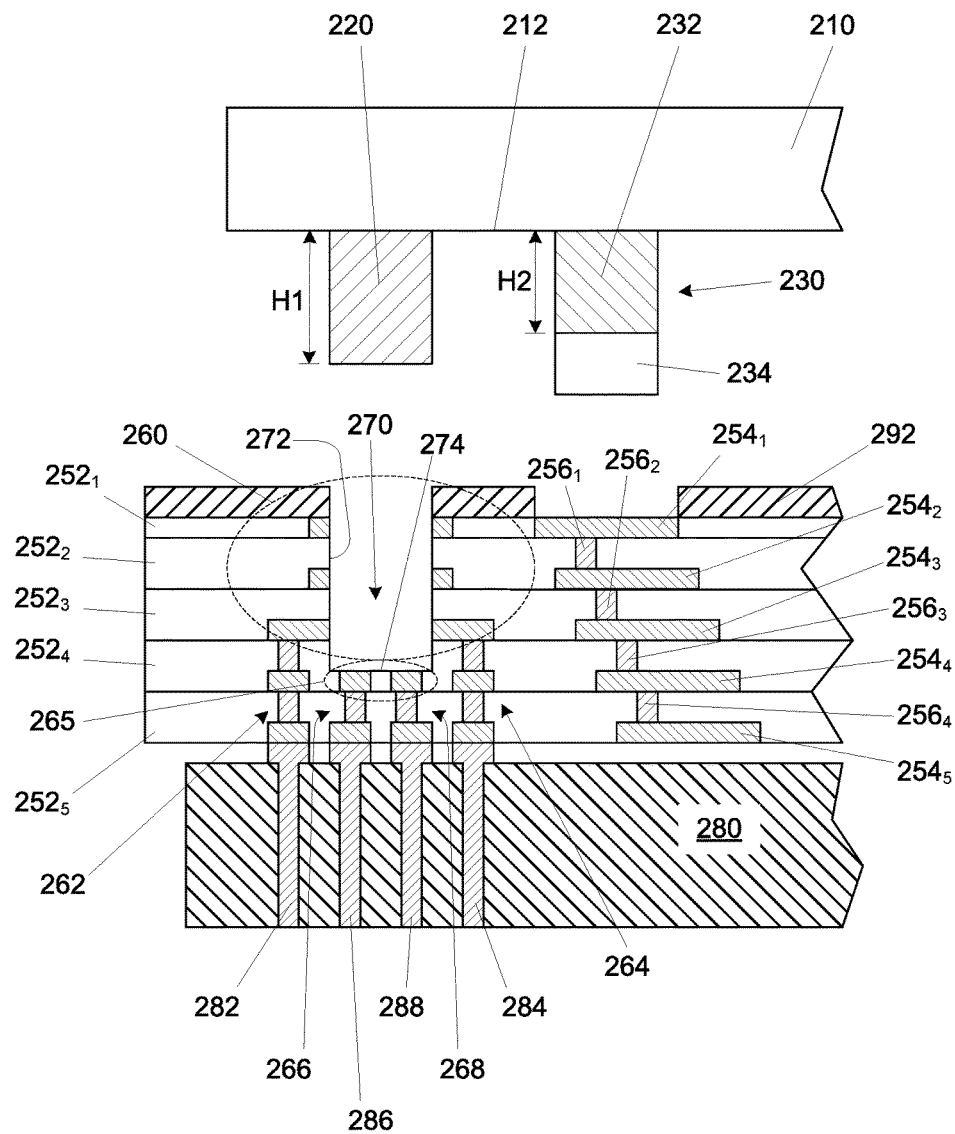
FIG. 5 is a side cross sectional view of aligning a microelectronic device to a microelectronic substrate, according to an embodiment of the present description.

Although the illustrations in FIGS. 2 and 3 show a height H1 of the magnetic alignment structure 220 being substantially the same as a height H2 of the interconnect structure 230, the height H1 of the magnetic alignment structure 220 may be greater than the height H2 of the interconnect structure 230, as illustrated in FIG. 5. The greater height H1 of the magnetic alignment structure 220 may be needed when a thicker solder material layer 234 is used for the attachment of the interconnect structures. As further shown in FIG. 5, a solder resist material layer 292 may be formed on the microelectronic substrate first surface 242, as will be understood to those skilled in the art.

Figure 6:
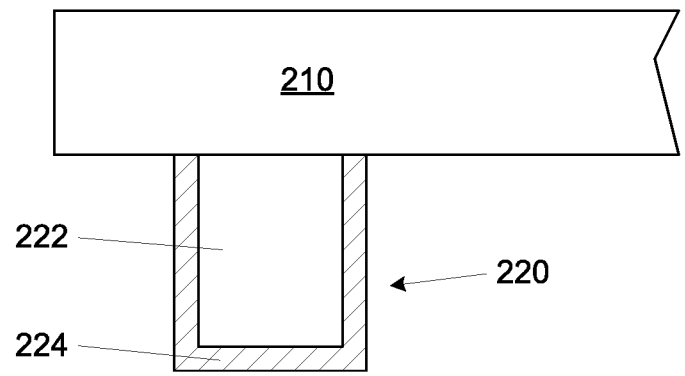
FIGS. 6 and 7 are side cross sectional views of magnetic alignment structures, according to embodiments of the present description.
Figure 7:
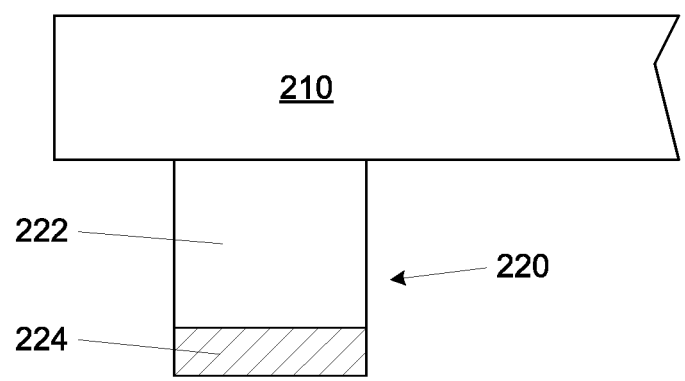

Although the illustrations in FIGS. 2-5 show the magnetic alignment structure 220 being unitary material, embodiments of the present description are not so limited. In one embodiment, the magnetic alignment structure 220 may comprise a projection 222 coated with a magnetic material 224, as shown in FIG. 6. In another embodiment, the magnetic alignment structure 220 may comprise a projection 222 capped with a magnetic material 224, as shown in FIG. 7.

Figure 8:
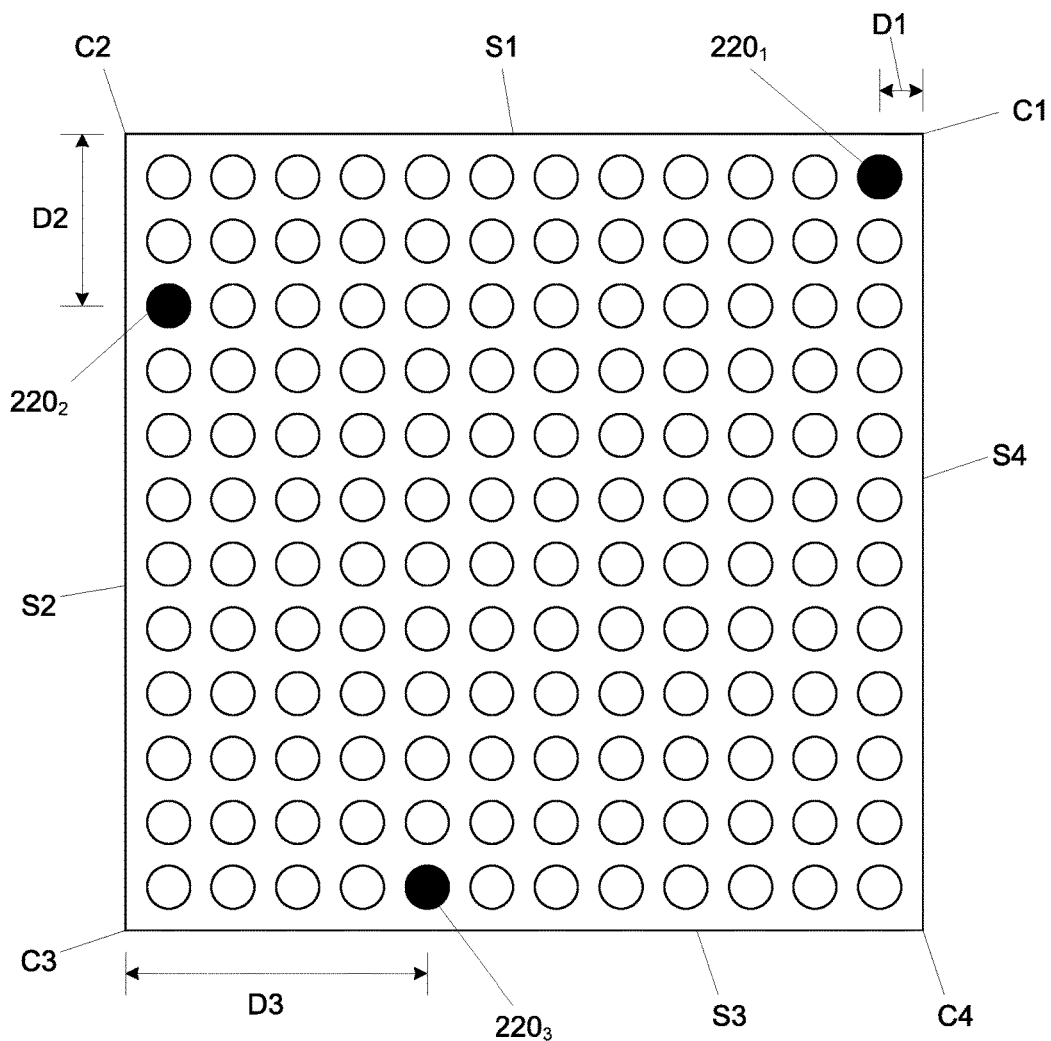
FIG. 8 is a plan view of a microelectronic device attachment surface, according to one embodiment of the present description.

As shown in FIG. 8, the microelectronic device attachment surface 212 is shown wherein the interconnect structures 230 are unshaded and the magnetic alignment structures (notated as elements $220_1$, $220_2$, and $220_3$ for clarity) are shaded black. As illustrated, the microelectronic device 210 may have four sides (elements S1, S2, S3, and S4) and four corners (elements C1, C2, C3, and C4). In one embodiment, at least one of the magnetic alignment structures $220_1$, $220_2$, and $220_3$ is placed proximate its respective side S1, S2, and S3. In another embodiment, the microelectronic device 210 has a plurality of the magnetic alignment structures $220_1$, $220_2$, and $220_3$, wherein the magnetic alignment structures $220_1$, $220_2$, and $220_3$ are placed at differing distances D1, D2, and D3, respectively, from their nearest corner C1, C2, and C3, which may ensure rotational alignment of the microelectronic device 210.

Figure 9:
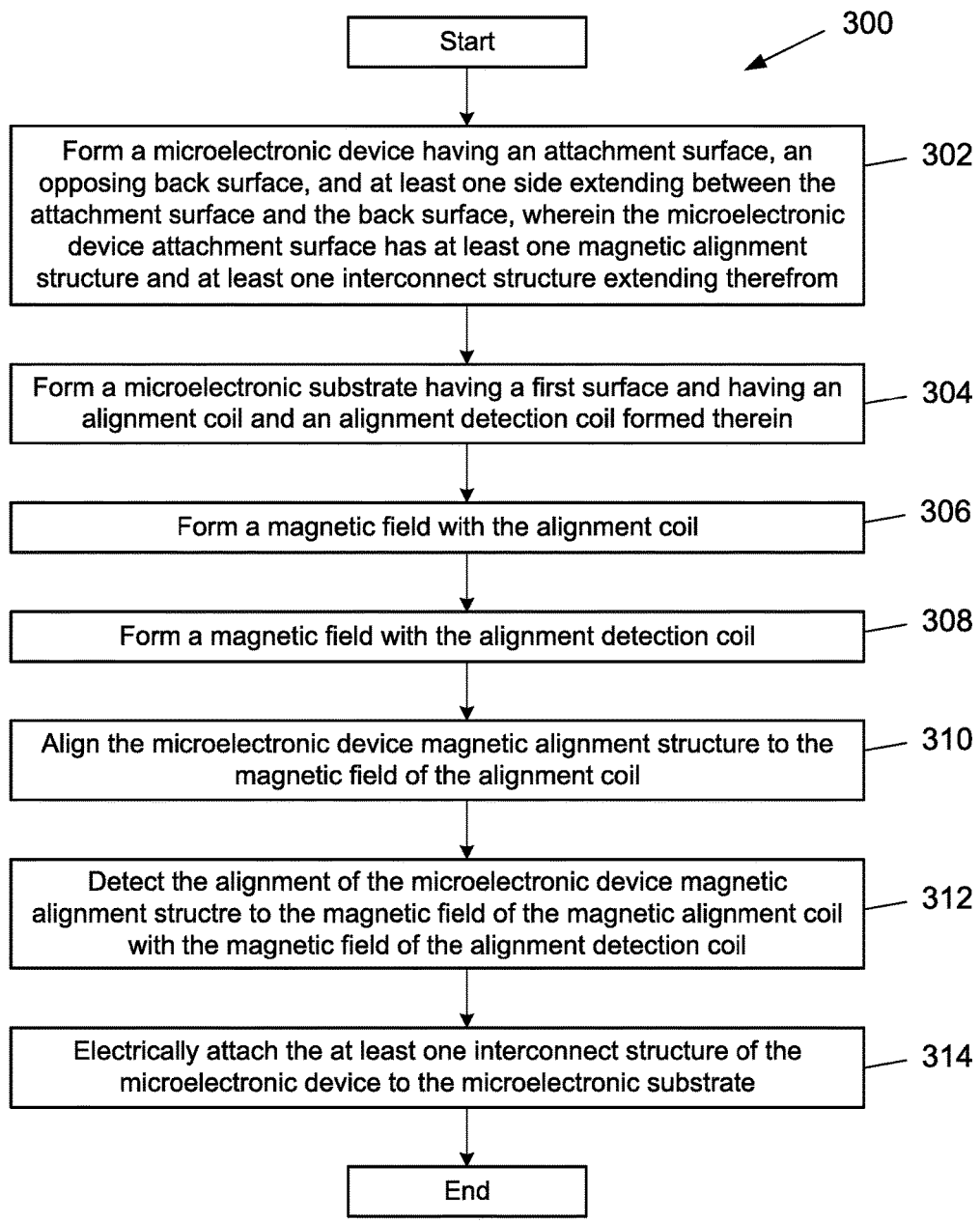
FIG. 9 is a flow chart of a process of fabricating a microelectronic package, according to an embodiment of the present description.

FIG. 9 is a flow chart of a process 300 of fabricating a microelectronic structure according to an embodiment of the present description. As set forth in block 302, a microelectronic device may be formed having an attachment surface, an opposing back surface, and at least one side extending between the attachment surface and the back surface, wherein the microelectronic device attachment surface has at least one magnetic alignment structure and at least one interconnect structure extending therefrom. A microelectronic substrate may be formed having a first surface and having an alignment coil and an alignment detection coil formed therein, as set forth in block 304. As set forth in block 306, a magnetic field may be formed with the alignment coil. A magnetic field may be formed with the alignment detection coil, as set forth in block 308. As set forth in block 310, the microelectronic device magnetic structure may be aligned to the magnetic field of the alignment coil. The alignment of the microelectronic device magnetic alignment structure to the magnetic field of the magnetic alignment coil may be detected with the magnetic field of the alignment detection coil, as set forth in block 312. As set forth in block 314, the at least one interconnect structure of the microelectronic device may be electrically attached to the microelectronic substrate.

Figure 10:
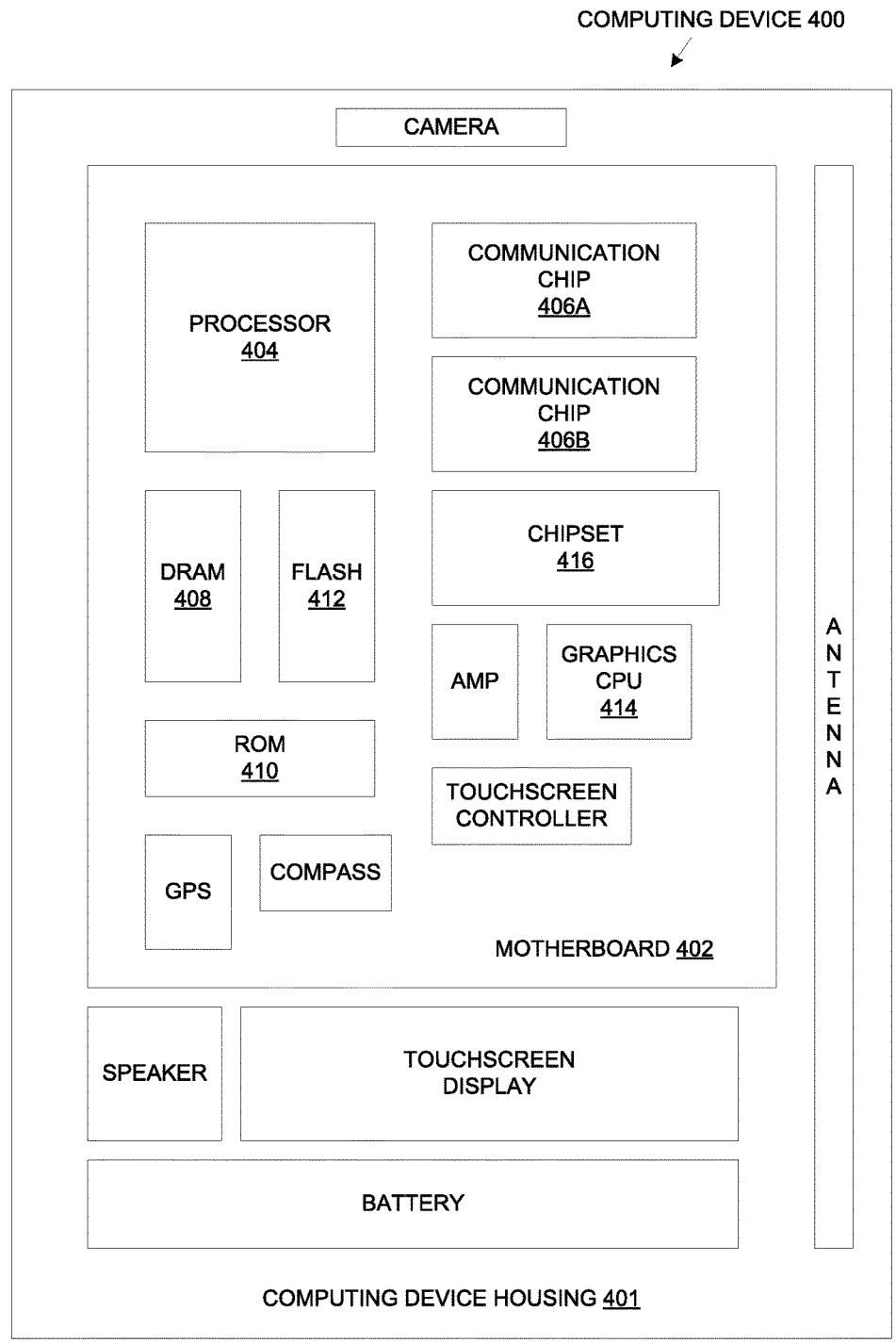
FIG. 10 illustrates a computing device in accordance with one implementation of the present description.

FIG. 10 illustrates an electronic system or computing device 400 in accordance with one implementation of the present description. The computing device 400 includes a computing device housing 401 having a board 402, such as a microelectronic substrate, disposed therein. The board may include a number of microelectronic components, including but not limited to a processor 404, at least one communication chip 406A, 406B, volatile memory 408, (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 402. In some implementations, at least one of the microelectronic components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 may include a microelectronic device having at least one magnetic attachment structure and at least one interconnect structure extending from an attachment surface of the microelectronic device, and a microelectronic substrate having an alignment coil formed therein, wherein the microelectronic device interconnect structures are electrically attached to the microelectronic substrate, as described above.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-10. The subject matter may be applied to other microelectronic device and assembly applications, as will be understood to those skilled in the art.

The following examples pertain to further embodiments, wherein Example 1 is a microelectronic structure, comprising a microelectronic device having an attachment surface, an opposing back surface, and at least one side extending between the attachment surface and the back surface, wherein the microelectronic device attachment surface has at least one magnetic alignment structure and at least one interconnect structure extending therefrom, and a microelectronic substrate having a first surface and having an alignment coil formed therein, wherein the at least microelectronic device interconnect structure is electrically attached to the microelectronic structure.

In Example 2, the subject matter of Example 1 can optionally include a first power line and a second power line extending from the alignment coil to a second surface of the microelectronic substrate.

In Example 3, the subject matter of either Example 1 or 2 can optionally include an opening extending into the microelectronic substrate from the microelectronic substrate first surface, wherein at least a portion of the alignment coil is exposed at a sidewall of the opening.

In Example 4, the subject matter of Example 1 can optionally include an alignment detection coil formed within the microelectronic substrate.

In Example 5, the subject matter of Example 4 can optionally include a third power line and a fourth power line extending from the alignment detection coil to a second surface of the microelectronic substrate.

In Example 6, the subject matter of either Example 4 or 5 can optionally include an opening extending into the microelectronic substrate from the microelectronic substrate first surface, wherein at least a portion of the alignment coil is exposed at a sidewall of the opening and wherein at least a portion of the alignment detection coil is exposed at a bottom of the opening.

In Example 7, the subject matter of any one of Examples 1, 2, 4, or 5 can optionally include a height of the at least one magnetic alignment structure being substantially the same as a height of the at least one interconnect structure.

In Example 8, the subject matter of any one of Examples 1, 2, 4, or 5 can optionally include a height of the at least one magnetic alignment structure being greater than a height of the at least one interconnect structure.

In Example 9, the subject matter of any one of Examples 1, 2, 4, or 5 can optionally include the at least one magnetic alignment structure being positioned adjacent the at least one microelectronic device side.

In Example 10, the subject matter of any one of Examples 1, 2, 4, or 5 can optionally include the microelectronic device further comprising at least one corner, wherein the at least one magnetic alignment structure comprises at least two magnetic alignment structures, and wherein a distance between one of the at least two magnetic alignment structures and the at least one microelectronic device corner closest thereto is greater than a distance between another of the at least two magnetic alignment structures and the at least one microelectronic device corner closest thereto.

In Example 11, the subject matter of any one of Examples 1, 2, 4, or 5 can optionally include the at least one magnetic alignment structure comprising a ferromagnetic material.

In Example 12, the subject matter of Example 11 can optionally include the ferromagnetic material comprising nickel.

In Example 13, the subject matter of any one of Examples 1, 2, 4, or 5 can optionally include the at least one magnetic alignment structure comprising a projection coated with a magnetic material.

In Example 14, the subject matter of any one of Examples 1, 2, 4, or 5 can optionally include the at least one magnetic alignment structure comprising a projection capped with a magnetic material.

In Example 15, the subject matter of any one of Examples 1, 2, 4, or 5 can optionally include the interconnect structure comprising a pillar having a layer of solder material disposed thereon.

The following examples pertain to further embodiments, wherein Example 16 is a method of fabricating a microelectronic structure, comprising: forming a microelectronic device having an attachment surface, an opposing back surface, and at least one side extending between the attachment surface and the back surface, wherein the microelectronic device attachment surface has at least one magnetic alignment structure and at least one interconnect structure extending therefrom; forming a microelectronic substrate having a first surface and having an alignment coil formed therein; forming a magnetic field with the alignment coil; aligning the microelectronic device magnetic alignment structure to the magnetic field of the alignment coil; and electrically attaching the at least one interconnect structure of the microelectronic device to the microelectronic substrate.

In Example 17, the subject matter of Example 16 can optionally include forming a first power line and a second power line extending from the alignment coil to a second surface of the microelectronic substrate.

In Example 18, the subject matter of either Example 16 or 17 can optionally include forming an opening extending into the microelectronic substrate from the microelectronic substrate first surface, wherein at least a portion of the alignment coil is exposed at a sidewall of the opening.

In Example 19, the subject matter of Example 16 can optionally include an alignment detection coil formed within the microelectronic substrate.

In Example 20, the subject matter of Example 19 can optionally include forming a third power line and a fourth power line extending from the alignment detection coil to a second surface of the microelectronic substrate.

In Example 21, the subject matter of Example 19 can optionally include forming a magnetic field with the alignment detection coil; and detecting the alignment of the microelectronic device magnetic alignment structure to the magnetic field of the magnetic alignment coil with the magnetic field of the alignment detection coil.

In Example 22, the subject matter of Example 19 can optionally include forming an opening extending into the microelectronic substrate from the microelectronic substrate first surface, wherein at least a portion of the alignment coil is exposed at a sidewall of the opening and wherein at least a portion of the alignment detection coil is exposed at a bottom of the opening.

In Example 23, the subject matter of any one of Examples 16, 17, 19, 20, 21, or 22 can optionally include forming the microelectronic device having at least one magnetic alignment structure and at least one interconnect structure extending from the microelectronic device attachment surface comprises forming the microelectronic device having at least one magnetic alignment structure and at least one interconnect structure extending from the microelectronic device attachment surface, wherein a height of the at least one magnetic alignment structure is substantially the same as a height of the at least one interconnect structure.

In Example 24, the subject matter of any one of Examples 16, 17, 19, 20, 21, or 22 can optionally include forming the microelectronic device having at least one magnetic alignment structure and at least one interconnect structure extending from the microelectronic device attachment surface comprises forming the microelectronic device having at least one magnetic alignment structure and at least one interconnect structure extending from the microelectronic device attachment surface, wherein a height of the at least one magnetic alignment structure is greater than a height of the at least one interconnect structure.

In Example 25, the subject matter of any one of Examples 16, 17, 19, 20, 21, or 22 can optionally include forming the microelectronic device having at least one interconnect structure extending from the microelectronic device attachment surface comprises forming the microelectronic device having at least one interconnect structure extending from the microelectronic device attachment surface, wherein the at least one magnetic alignment structure is positioned adjacent the at least one microelectronic device side.

In Example 26, the subject matter of any one of Examples 16, 17, 19, 20, 21, or 22 can optionally include forming the microelectronic device further comprising at least one corner, wherein the at least one magnetic alignment structure comprises at least two magnetic alignment structures, and wherein a distance between one of the at least two magnetic alignment structures and the at least one microelectronic device corner closest thereto is greater than a distance between another of the at least two magnetic alignment structures and the at least one microelectronic device corner closest thereto.

In Example 27, the subject matter of any one of Examples 16, 17, 19, 20, 21, or 22 can optionally include forming the microelectronic device having at least one magnetic alignment structure extending from the microelectronic device attachment surface comprises forming the microelectronic device having at least one magnetic alignment structure comprising a ferromagnetic material extending from the microelectronic device attachment surface.

In Example 28, the subject matter of Example 27 can optionally include forming the microelectronic device having at least one magnetic alignment structure comprising a ferromagnetic material extending from the microelectronic device attachment surface comprises forming the microelectronic device having at least one magnetic alignment structure comprising nickel extending from the microelectronic device attachment surface.

In Example 29, the subject matter of any one of Examples 16, 17, 19, 20, 21, or 22 can optionally include forming the microelectronic device having at least one magnetic alignment structure comprises forming the at least one magnetic alignment structure comprising forming a projection coated with a magnetic material.

In Example 30, the subject matter of any one of Examples 16, 17, 19, 20, 21, or 22 can optionally include the at least one magnetic alignment structure comprising a projection capped with a magnetic material.

In Example 31, the subject matter of any one of Examples 16, 17, 19, 20, 21, or 22 can optionally include the interconnect structure comprising a pillar having a layer of solder material disposed thereon.

The following examples pertain to further embodiments, wherein Example 32 is an electronic system, comprising a housing; a microelectronic substrate within the housing having a first surface and having an alignment coil formed therein; and a microelectronic device comprising a microelectronic device having an attachment surface, wherein the microelectronic device attachment surface has at least one magnetic alignment structure and at least one interconnect structure extending from an attachment surface of the microelectronic device, wherein the at least microelectronic device interconnect structure is electrically attached to the microelectronic structure first surface.

In Example 33, the subject matter of Example 32 can optionally include a first power line and a second power line extending from the alignment coil to a second surface of the microelectronic substrate.

In Example 34, the subject matter of either Example 32 or 33 can optionally include an opening extending into the microelectronic substrate from the microelectronic substrate first surface, wherein at least a portion of the alignment coil is exposed at a sidewall of the opening.

In Example 35, the subject matter of Example 32 can optionally include an alignment detection coil formed within the microelectronic substrate.

In Example 36, the subject matter of Example 35 can optionally include a third power line and a fourth power line extending from the alignment detection coil to a second surface of the microelectronic substrate.

In Example 37, the subject matter of either Example 35 or 36 can optionally include an opening extending into the microelectronic substrate from the microelectronic substrate first surface, wherein at least a portion of the alignment coil is exposed at a sidewall of the opening and wherein at least a portion of the alignment detection coil is exposed at a bottom of the opening.

In Example 38, the subject matter of any one of Examples 32, 33, 35, or 36 can optionally include a height of the at least one magnetic alignment structure being substantially the same as a height of the at least one interconnect structure.

In Example 39, the subject matter of any one of Examples 32, 33, 35, or 36 can optionally include a height of the at least one magnetic alignment structure being greater than a height of the at least one interconnect structure.

In Example 40, the subject matter of any one of Examples 32, 33, 35, or 36 can optionally include the at least one magnetic alignment structure being positioned adjacent the at least one microelectronic device side.

In Example 41, the subject matter of any one of Examples 32, 33, 35, or 36 can optionally include the microelectronic device further comprising at least one corner, wherein the at least one magnetic alignment structure comprises at least two magnetic alignment structures, and wherein a distance between one of the at least two magnetic alignment structures and the at least one microelectronic device corner closest thereto is greater than a distance between another of the at least two magnetic alignment structures and the at least one microelectronic device corner closest thereto.

In Example 42, the subject matter of any one of Examples 32, 33, 35, or 36 can optionally include the at least one magnetic alignment structure comprising a ferromagnetic material.

In Example 43, the subject matter of Example 42 can optionally include the ferromagnetic material comprising nickel.

In Example 44, the subject matter of any one of Examples 32, 33, 35, or 36 can optionally include the at least one magnetic alignment structure comprising a projection coated with a magnetic material.

In Example 45, the subject matter of any one of Examples 32, 33, 35, or 36 can optionally include the at least one magnetic alignment structure comprising a projection capped with a magnetic material.

In Example 46, the subject matter of any one of Examples 32, 33, 35, or 36 can optionally include the interconnect structure comprising a pillar having a layer of solder material disposed thereon.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A method for fabricating a microelectronic structure, comprising:
    forming a microelectronic device having an attachment surface, an opposing back surface, and at least one side extending between the attachment surface and the back surface, wherein the microelectronic device attachment surface has at least one magnetic alignment structure and at least one interconnect structure extending therefrom;
    forming a microelectronic substrate having a first surface and having an alignment coil formed therein;
    forming an alignment detection coil within the microelectronic substrate;
    forming a magnetic field with the alignment coil;
    aligning the microelectronic device magnetic alignment structure to the magnetic field of the alignment coil;
    forming a magnetic field with the alignment detection coil;
    detecting the alignment of the microelectronic device magnetic alignment structure to the magnetic field of the magnetic alignment coil with the magnetic field of the alignment detection coil; and
    electrically attaching the at least one interconnect structure of the microelectronic device to the microelectronic substrate.

2. The method of claim 1, wherein forming the microelectronic device having at least one magnetic alignment structure and at least one interconnect structure extending from the microelectronic device attachment surface comprises forming the microelectronic device having at least one magnetic alignment structure and at least one interconnect structure extending from the microelectronic device attachment surface, wherein a height of the at least one magnetic alignment structure is substantially the same as a height of the at least one interconnect structure.

3. The method of claim 1, wherein forming the microelectronic device having at least one magnetic alignment structure and at least one interconnect structure extending from the microelectronic device attachment surface comprises forming the microelectronic device having at least one magnetic alignment structure and at least one interconnect structure extending from the microelectronic device attachment surface, wherein a height of the at least one magnetic alignment structure is greater than a height of the at least one interconnect structure.

4. The method of claim 1, wherein forming the microelectronic device having at least one interconnect structure extending from the microelectronic device attachment surface comprises forming the microelectronic device having at least one interconnect structure extending from the microelectronic device attachment surface, wherein the at least one magnetic alignment structure is positioned adjacent the at least one microelectronic device side.

5. The method of claim 1, wherein forming the microelectronic device further comprises forming the microelectronic device having at least one corner, wherein the at least one magnetic alignment structure comprises at least two magnetic alignment structures, and wherein a distance between one of the at least two magnetic alignment structures and the at least one microelectronic device corner closest thereto is greater than a distance between another of the at least two magnetic alignment structures and the at least one microelectronic device corner closest thereto.

6. The method of claim 1, wherein forming the microelectronic device having at least one magnetic alignment structure extending from the microelectronic device attachment surface comprises forming the microelectronic device having at least one magnetic alignment structure comprising a ferromagnetic material extending from the microelectronic device attachment surface.

7. The method of claim 6, wherein forming the microelectronic device having at least one magnetic alignment structure comprising the ferromagnetic material extending from the microelectronic device attachment surface comprises forming the microelectronic device having at least one magnetic alignment structure comprising nickel extending from the microelectronic device attachment surface.

8. A method for fabricating a microelectronic structure, comprising:
    forming a microelectronic device having an attachment surface, an opposing back surface, and at least one side extending between the attachment surface and the back surface, wherein the microelectronic device attachment surface has at least one magnetic alignment structure and at least one interconnect structure extending therefrom;
    forming a microelectronic substrate having a first surface and having an alignment coil formed therein, and having an unfilled opening extending into the microelectronic substrate from the microelectronic substrate first surface, wherein the unfilled opening is defined by at least one sidewall and a bottom and wherein a portion of the alignment coil is exposed to the unfilled opening at the least one unfilled opening sidewall;
    forming a magnetic field with the alignment coil;
    aligning the microelectronic device magnetic alignment structure to the magnetic field of the alignment coil; and
    electrically attaching the at least one interconnect structure of the microelectronic device to the microelectronic substrate.

9. The method of claim 8, further including forming an alignment detection coil within the microelectronic substrate.

10. The method of claim 9, further comprising:
    forming a magnetic field with the alignment detection coil;

detecting the alignment of the microelectronic device magnetic alignment structure to the magnetic field of the magnetic alignment coil with the magnetic field of the alignment detection coil.

11. The method of claim 9, wherein at least a portion of the alignment detection coil is exposed to the unfilled opening at the unfilled opening bottom.

12. The method of claim 8, wherein forming the microelectronic device having at least one magnetic alignment structure and at least one interconnect structure extending from the microelectronic device attachment surface comprises forming the microelectronic device having at least one magnetic alignment structure and at least one interconnect structure extending from the microelectronic device attachment surface, wherein a height of the at least one magnetic alignment structure is substantially the same as a height of the at least one interconnect structure.

13. The method of claim 8, wherein forming the microelectronic device having at least one magnetic alignment structure and at least one interconnect structure extending from the microelectronic device attachment surface comprises forming the microelectronic device having at least one magnetic alignment structure and at least one interconnect structure extending from the microelectronic device attachment surface, wherein a height of the at least one magnetic alignment structure is greater than a height of the at least one interconnect structure.

14. The method of claim 8, wherein forming the microelectronic device having at least one interconnect structure extending from the microelectronic device attachment surface comprises forming the microelectronic device having at least one interconnect structure extending from the microelectronic device attachment surface, wherein the at least one magnetic alignment structure is positioned adjacent the at least one microelectronic device side.

15. The method of claim 8, wherein forming the microelectronic device further comprises forming the microelectronic device having at least one corner, wherein the at least one magnetic alignment structure comprises at least two magnetic alignment structures, and wherein a distance between one of the at least two magnetic alignment structures and the at least one microelectronic device corner closest thereto is greater than a distance between the other of the at least two magnetic alignment structures and the at least one microelectronic device corner closest thereto.

16. The method of claim 8, wherein forming the microelectronic device having at least one magnetic alignment structure extending from the microelectronic device attachment surface comprises forming the microelectronic device having at least one magnetic alignment structure comprising a ferromagnetic material extending from the microelectronic device attachment surface.

17. The method of claim 16, wherein forming the microelectronic device having at least one magnetic alignment structure comprising a ferromagnetic material extending from the microelectronic device attachment surface comprises forming the microelectronic device having at least one magnetic alignment structure comprising nickel extending from the microelectronic device attachment surface.

* * * * *